(12) United States Patent
Sakaya et al.

(10) Patent No.: US 9,354,509 B2
(45) Date of Patent: May 31, 2016

(54) MASK BLANK, TRANSFER MASK, METHOD OF MANUFACTURING A TRANSFER MASK, AND METHOD OF MANUFACTURING A SEMICONDUCTOR DEVICE

(71) Applicant: HOYA CORPORATION, Tokyo (JP)

(72) Inventors: Noriyuki Sakaya, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 244 days.

(21) Appl. No.: 14/222,794

(22) Filed: Mar. 24, 2014

(65) Prior Publication Data

US 2014/0205937 A1 Jul. 24, 2014

Related U.S. Application Data

(63) Continuation of application No. 13/611,707, filed on Sep. 12, 2012, now Pat. No. 8,715,892.

(30) Foreign Application Priority Data

Sep. 14, 2011 (JP) .................................. 2011-200195

(51) Int. Cl.
*G03F 1/26* (2012.01)
*G03F 1/58* (2012.01)
*G03F 7/20* (2006.01)
*B82Y 10/00* (2011.01)
*B82Y 30/00* (2011.01)

(52) U.S. Cl.
CPC . *G03F 1/26* (2013.01); *B82Y 10/00* (2013.01); *G03F 1/58* (2013.01); *G03F 7/20* (2013.01); *B82Y 30/00* (2013.01)

(58) Field of Classification Search
CPC ..................................... G03F 1/26; G03F 1/54
See application file for complete search history.

(56) References Cited

U.S. PATENT DOCUMENTS

2009/0226826 A1 9/2009 Nozawa
2009/0246645 A1 10/2009 Nozawa

FOREIGN PATENT DOCUMENTS

| JP | 2007-241136 A | 9/2007 |
| JP | 2009-230112 A | 10/2009 |
| WO | 2005/124454 A1 | 12/2005 |
| WO | 2010/113475 A1 | 10/2010 |

OTHER PUBLICATIONS

Communication dated Apr. 13, 2016, from the Japanese Patent Office in counterpart application No. 2012-186141.

*Primary Examiner* — Stephen Rosasco
(74) *Attorney, Agent, or Firm* — Sughrue Mion, PLLC

(57) ABSTRACT

A mask blank is used for manufacturing a binary mask adapted to be applied with ArF excimer laser exposure light and has a light-shielding film for forming a transfer pattern on a transparent substrate. The light-shielding film has a laminated structure of a lower layer and an upper layer and has an optical density of 2.8 or more for the exposure light. The lower layer is made of a material containing tantalum and nitrogen and has a thickness of 33 nm or more. The upper layer is made of a material containing tantalum and oxygen and has a thickness of 3 nm or more. The phase difference between the exposure light transmitted through the light-shielding film and the exposure light transmitted in air for a distance equal to the thickness of the light-shielding film is 60 degrees or less.

14 Claims, 6 Drawing Sheets

MASK BLANK, TRANSFER MASK, METHOD OF MANUFACTURING A TRANSFER MASK, AND METHOD OF MANUFACTURING A SEMICONDUCTOR DEVICE

This is a Continuation of application Ser. No. 13/611,707 filed Sep. 12, 2012, claiming priority based on Japanese Patent Application No. 2011-200195, filed on Sep. 14, 2011, the contents of all of which are incorporated herein by reference in their entirety.

TECHNICAL FIELD

This invention relates to a mask blank and a transfer mask for use in the manufacture of semiconductor devices or the like and further relates to a method of manufacturing a transfer mask and a method of manufacturing a semiconductor device.

BACKGROUND ART

The miniaturization of semiconductor devices and the like is advantageous in bringing about an improvement in performance and function (higher-speed operation, lower power consumption, etc.) and a reduction in cost and thus has been accelerated more and more. The lithography technique has been supporting this miniaturization and transfer masks are a key technique along with exposure apparatuses and resist materials.

In recent years, the development of the DRAM half-pitch (hp) 45 nm to 32 nm generations according to the semiconductor device design rule has been progressing. This corresponds to ¼ to ⅙ of a wavelength 193 nm of ArF excimer laser exposure light (hereinafter referred to as "ArF exposure light"). Particularly, in the DRAM hp45 nm and subsequent generations, only the application of the resolution enhancement technology (RET) such as the conventional phase shift method, oblique illumination method, and pupil filter method and the optical proximity correction (OPC) technique has been becoming insufficient and the hyper-NA technique (immersion lithography) has been becoming necessary.

In the meantime, circuit patterns that are necessary in the manufacture of semiconductor devices are formed in sequence by exposing a transfer mask (reticle) pattern a plurality of times onto a semiconductor wafer. For example, a reduced projection exposure apparatus (exposure apparatus) with a predetermined reticle set therein repeatedly projects and exposes a pattern of the reticle while sequentially shifting a projection area on a semiconductor wafer (step-and-repeat system), or repeatedly projects and exposes a pattern of the reticle while synchronously scanning the reticle and a semiconductor wafer with respect to a projection optical system (step-and-scan system). These systems have been predominant. As a consequence, a predetermined number of integrated circuit chip areas are formed in the wafer.

A transfer mask (reticle) has an area formed with a transfer pattern and a peripheral area around the transfer pattern area, i.e. an edge area along four sides in the transfer mask (reticle). When exposing the transfer pattern of the transfer mask (reticle) while sequentially shifting a projection area on a semiconductor wafer, the transfer pattern is exposed and transferred to the projection areas so that the transfer mask peripheral areas overlap each other for the purpose of increasing the number of integrated circuit chips to be formed. Normally, a mask stage of an exposure apparatus is provided with a shielding plate for blocking irradiation of exposure light onto the transfer mask peripheral area. However, in the case of blocking the irradiation of the exposure light by the shielding plate, there are problems of positional accuracy limitation and of light diffraction phenomenon so that it is not possible to avoid leakage of the exposure light to the transfer mask peripheral area (hereinafter, this exposure light will be referred to as "leakage light"). If this leakage light to the transfer mask peripheral area is transmitted through the transfer mask, there is a possibility of sensitizing a resist on the wafer. In order to prevent the sensitization of the resist on the wafer due to such overlapping exposure, a light-shielding band (light-shielder band or light-shielder ring) is formed in the transfer mask peripheral area by mask processing. Normally, it is reported that, in an area, where the light-shielding band is formed, of the transfer mask peripheral area, an OD (optical density) value of 3 or more is desirable and that of at least about 2.8 is necessary for preventing the sensitization of the resist on the wafer due to the overlapping exposure.

In the case of a binary mask, since the light-shielding performance of a light-shielding film is high, the light-shielding film serves to form a light-shielding film pattern in a transfer pattern area and further to form a light-shielding band in a peripheral area around the transfer pattern area.

The light-shielding film is also required to have a certain low front-surface reflectance for exposure light. In view of this, the light-shielding film generally has a laminated structure of at least two layers, i.e. a layer for ensuring the light-shielding performance and a layer (front-surface antireflection layer) for reducing the front-surface reflectance. The front-surface antireflection layer has a difficulty in enhancing the light-shielding performance in terms of its properties and thus cannot contribute to a reduction in the thickness of the light-shielding film. The reduction in the thickness of the light-shielding film has these restrictions.

When the thickness of the light-shielding film is reduced, the OD (optical density) value is also reduced. In the case of a chromium-based light-shielding film, the total thickness of about 60 nm is minimally required for achieving OD=3 which is generally required, and therefore, a large reduction in the thickness of the film is difficult to achieve (see, e.g. JP-A-2007-241136 (Patent Document 1), paragraph [0005]).

JP-A-2009-230112 (Patent Document 2) discloses a binary mask blank comprising a light-shielding film having a laminated structure of tantalum-based materials, such as a light-shielding film having a laminated structure of a TaN layer and a TaO layer from the substrate side. Since a tantalum-based material has a higher light-shielding performance than that of a chromium-based material, even if the total thickness of the film is less than 60 nm, it is possible to achieve OD=3 which is generally required.

On the other hand, WO2005/124454 (Patent Document 3) discloses a mask blank comprising a light-semitransmissive film. This light-semitransmissive film has a property of transmitting exposure light at a predetermined transmittance and this property is substantially the same as that of a conventional halftone phase shift film. However, this light-semitransmissive film also has a property such that the phase difference between exposure light transmitted through a light-semitransmissive portion formed with the light-semitransmissive film and exposure light transmitted through a light-transmissive portion formed with no light-semitransmissive film is small. This property is totally different from that of the conventional halftone phase shift film. The mask blank comprising this light-semitransmissive film is used for manufacturing an enhancer mask.

SUMMARY OF THE INVENTION

In the meantime, in binary masks in the DRAM half-pitch (hp) 45 nm and subsequent generations according to the semiconductor device design rule, the line width of a transfer pattern of a transfer mask is smaller than the wavelength 193 nm of ArF exposure light and, as a result of adopting the resolution enhancement technology for coping with it, there has arisen a problem that if the thickness of a light-shielding film pattern in a transfer pattern area (main pattern area) is large, a bias due to the electromagnetic field (EMF) effect becomes large. A bias due to the EMF effect largely affects the CD accuracy of the line width of a transfer pattern onto a resist on a semiconductor wafer. Therefore, in order to suppress the influence due to the EMF bias, it is necessary to carry out simulation of the EMF effect, thereby performing correction of a transfer pattern to be formed in a transfer mask. Calculation of this transfer pattern correction becomes more complicated as the EMF bias increases. Further, a transfer pattern after the correction also becomes more complicated as the EMF bias increases. As a consequence, a large load is applied to the manufacture of the transfer mask. These new problems have arisen due to the increase in EMF bias.

Optical simulation in mask design of a binary mask is largely aimed at calculating a shape of a correction pattern such as OPC or SRAF to be additionally disposed, a correction amount (bias amount) of pattern line width, and so on so that a designed transfer pattern is exposed and transferred to a transfer object (resist on a wafer, or the like) as designed. As this mask-design optical simulation, there is TMA (thin mask analysis). TMA calculates a shape of a correction pattern and a correction amount of pattern line width assuming that a light-shielding film of a transfer mask is an ideal film that has a predetermined optical density with its thickness being zero. Because of the simple simulation being carried out with the ideal film, there is a large merit that the calculation load of the simulation is small. However, since this is the simulation that does not take into account the EMF effect, the TMA simulation results alone are insufficient for a recent fine pattern which is largely affected by the EMF effect. It is to be noted that the EMF bias can be calculated by subtracting a bias amount calculated by TMA from a bias amount calculated by optical simulation that takes into account the EMF effect.

The present inventors have intensively studied the subject of the above-mentioned EMF effect.

First, the present inventors have paid attention to the fact that, in the case of a light-shielding film with a small influence of the EMF effect, it is easy to take advantage of the TMA simulation and thus to reduce the load of EMF bias correction calculation.

As a result of further studying a light-shielding film with a small influence of the EMF effect, it has been found that, even in the case of a binary transfer mask, the phase difference between exposure light transmitted through a light-shielding portion formed with a light-shielding film and exposure light transmitted through a light-transmissive portion formed with no light-shielding film (hereinafter, this phase difference will be referred to simply as a "phase difference") is related to the influence of the EMF effect. Specifically, it has been found by simulation that as the phase difference of the light-shielding film decreases, the EMF bias also decreases.

In layers forming the light-shielding film, a front-surface antireflection layer is required to have an antireflection function and thus is required to contain a certain or more amount of oxygen and/or nitrogen so that the refractive index thereof inevitably becomes high. Therefore, the front-surface antireflection layer serves to produce a large plus-direction phase difference. In order to provide the front-surface antireflection layer with the antireflection function, the front-surface antireflection layer should be formed of a material with a somewhat small extinction coefficient k. Since most of the light-shielding performance of the entire light-shielding film should be achieved by a light-shielding layer, the light-shielding layer should be formed of a material with a large extinction coefficient k.

Taking these into account, first, a material with a small refractive index n and with a large extinction coefficient k has been selected as the light-shielding layer. As the material having such properties, use can be made of a transition metal silicide with a relatively low content of oxygen and/or nitrogen. In recent years, the factor that causes the lifetime of a transfer mask to be short, such as the generation of haze, has gradually been eliminated so that it has been becoming important to prolong the lifetime of use of the transfer mask. In order to further prolong the lifetime of use of the transfer mask, it is necessary to use as a light-shielding film a material which has high resistance when the material is continuously irradiated with ArF exposure light (hereinafter, this resistance will be referred to as "ArF light fastness"). A transition metal silicide-based material is relatively low in ArF light fastness and this has arisen as a problem. On the other hand, although it is difficult to make the refractive index n of a tantalum-based material as small as that of the transition metal silicide-based material, the tantalum-based material has a relatively high extinction coefficient k and, above all, is excellent in ArF light fastness.

As a result of intensively studying a light-shielding film with a small EMF bias that uses a tantalum-based material, it has been found that if the phase difference of a light-shielding film having a laminated structure of a lower layer containing tantalum and nitrogen and an upper layer containing tantalum and oxygen in this order from the transparent substrate side is 60 degrees or less, even when the pitch of a transfer pattern (line & space pattern) formed in the light-shielding film is 90 nm on a transfer object (resist film on a semiconductor wafer), the EMF bias can be suppressed to 10 nm or less, which is thus very effective.

It has further been found that, in order to achieve the optical density of 2.8 or more and the phase difference of 60 degrees or less with the light-shielding film having the laminated structure of the lower layer containing tantalum and nitrogen and the upper layer containing tantalum and oxygen in this order from the transparent substrate side, the thickness of the lower layer should be set to 33 nm or more.

On the other hand, owing to the development of exposure apparatuses in recent years, the influence of front-surface reflection from a light-shielding film upon exposure and transfer has been decreasing so that even if the front-surface reflectance is more or less greater than conventional, it tends to be allowed. Taking these into account, as a result of loosely setting the front-surface reflectance of the light-shielding film to 40% or less and making a study, it has been found that, in the case of the laminated structure with the lower layer containing tantalum and nitrogen, if the thickness of the upper layer is 3 nm or more, the front-surface reflectance can be suppressed to 40% or less.

Synthetically taking into account the results of various studies described above, this invention has been completed.

It is an object of this invention to provide a mask blank which comprises a light-shielding film formed of tantalum-based materials and sufficiently reduced in EMF bias so that various loads applied to the manufacture of a transfer mask can be largely reduced and that the light fastness to ArF exposure light of the transfer mask can be enhanced, and further to provide such a transfer mask, a method of manufacturing such a transfer mask, and a method of manufacturing a semiconductor device using such a transfer mask. Further, it is an object of this invention to provide a mask blank which, in addition to the above, can simultaneously satisfy a condition that after the mask blank is formed into a transfer mask, a light-shielding film ensures an optical density that can prevent sensitization of a resist film on a semiconductor wafer due to leakage light caused by overlapping exposure, and further to provide such a transfer mask, a method of manufacturing such a transfer mask, and a method of manufacturing a semiconductor device using such a transfer mask.

This invention has the following structures.

(Structure 1)

A mask blank for manufacturing a binary mask adapted to be applied with ArF excimer laser exposure light, comprising:
a transparent substrate; and
a light-shielding film formed on the transparent substrate, the light-shielding film serving to form a transfer pattern;
wherein the light-shielding film has a laminated structure of a lower layer and an upper layer and has an optical density of 2.8 or more for the exposure light,
the lower layer is made of a material containing tantalum and nitrogen and has a thickness of 33 nm or more,
the upper layer is made of a material containing tantalum and oxygen and has a thickness of 3 nm or more, and
a phase difference between the exposure light transmitted through the light-shielding film and the exposure light transmitted in air for a distance equal to a thickness of the light-shielding film is 60 degrees or less.

(Structure 2)

The mask blank according to structure 1, wherein the lower layer has a refractive index n of less than 2.0 and an extinction coefficient k of 2.0 or more.

(Structure 3)

The mask blank according to structure 1 or 2, wherein the upper layer has an extinction coefficient k of 1.3 or more.

(Structure 4)

A method of manufacturing a transfer mask, comprising:
an etching step of patterning, by etching, the light-shielding film in the mask blank according to anyone of structures 1 to 3.

(Structure 5)

A binary transfer mask adapted to be applied with ArF excimer laser exposure light, comprising:
a transparent substrate; and
a light-shielding film formed on the a transparent substrate, the light-shielding film having a transfer pattern;
wherein the light-shielding film has a laminated structure of a lower layer and an upper layer and has an optical density of 2.8 or more for the exposure light,
the lower layer is made of a material containing tantalum and nitrogen and has a thickness of 33 nm or more,
the upper layer is made of a material containing tantalum and oxygen and has a thickness of 3 nm or more, and
a phase difference between the exposure light transmitted through the light-shielding film and the exposure light transmitted in air for a distance equal to a thickness of the light-shielding film is 60 degrees or less.

(Structure 6)

The binary transfer mask according to structure 5, wherein the lower layer has a refractive index n of less than 2.0 and an extinction coefficient k of 2.0 or more.

(Structure 7)

The binary transfer mask according to structure 5 or 6, wherein the upper layer has an extinction coefficient k of 1.3 or more.

(Structure 8)

The binary transfer mask according to anyone of structures 5 to 7, wherein the transfer pattern of the light-shielding film includes a line & space pattern of half-pitch 45 nm or less.

(Structure 9)

A method of manufacturing a semiconductor device, comprising: exposing and transferring the transfer pattern to a resist film on a semiconductor substrate using the binary transfer mask according to anyone of structures 5 to 8.

(Structure 10)

The method according to structure 9, wherein the transfer pattern which is transferred to the resist film on the semiconductor substrate includes a line & space pattern of half-pitch 45 nm or less.

According to this invention, since the light-shielding film is formed of the tantalum-based materials and is sufficiently reduced in EMF bias, various loads applied to the manufacture of the transfer mask can be largely reduced and the light fastness to ArF exposure light of the transfer mask can be enhanced. Further, according to this invention, it is possible to simultaneously satisfy a condition that, in the form of the transfer mask, the light-shielding film ensures an optical density that can prevent sensitization of a resist film on a semiconductor wafer due to leakage light caused by overlapping exposure.

DETAILED DESCRIPTION OF THE INVENTION

Hereinbelow, this invention will be described in detail.

A mask blank according to this invention is used for manufacturing a binary mask adapted to be applied with ArF excimer laser exposure light and includes a light-shielding film for forming a transfer pattern on a transparent substrate. The light-shielding film has a laminated structure of a lower layer and an upper layer and has an optical density of 2.8 or more for the exposure light. The lower layer is made of a material containing tantalum and nitrogen and has a thickness of 33 nm or more. The upper layer is made of a material containing tantalum and oxygen and has a thickness of 3 nm or more. The phase difference between the exposure light transmitted through the light-shielding film and the exposure light transmitted in air for a distance equal to the thickness of the light-shielding film is 60 degrees or less (structure 1).

Further, a binary transfer mask according to this invention is adapted to be applied with ArF excimer laser exposure light and includes a light-shielding film having a transfer pattern on the a transparent substrate. The light-shielding film has a laminated structure of a lower layer and an upper layer and has an optical density of 2.8 or more for the exposure light. The lower layer is made of a material containing tantalum and nitrogen and has a thickness of 33 nm or more. The upper layer is made of a material containing tantalum and oxygen and has a thickness of 3 nm or more. A phase difference between the exposure light transmitted through the light-shielding film and the exposure light transmitted in air for a distance equal to a thickness of the light-shielding film is 60 degrees or less (structure 5).

According to each of the structures described above, since the light-shielding film is formed of the tantalum-based materials and is sufficiently reduced in EMF bias, various loads applied to the manufacture of the transfer mask can be largely reduced and the light fastness to ArF exposure light of the transfer mask can be enhanced. Further, according to this invention, it is possible to simultaneously satisfy a condition that, in the form of the transfer mask, the light-shielding film ensures an optical density that can prevent sensitization of a resist film on a semiconductor wafer due to leakage light caused by overlapping exposure.

Figure 1:
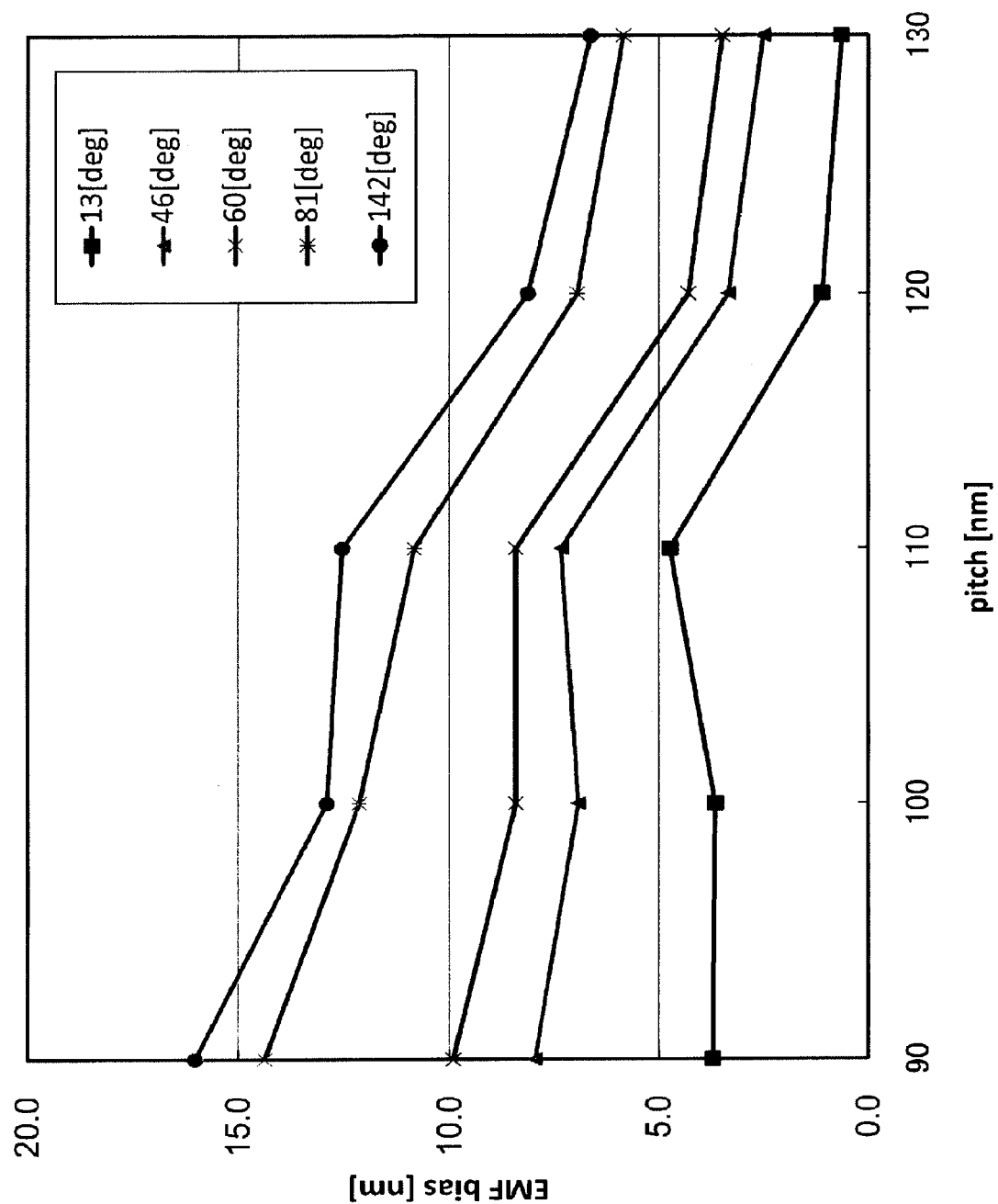
FIG. 1 is a graph showing the relationships between the full pitch of transfer patterns in a plurality of light-shielding films adapted to produce different phase differences and the EMF bias.

FIG. 1 shows the results of calculating, by simulation, EMF biases that are generated when transfer masks respectively having line & space patterns (transfer patterns) of various pattern pitches in light-shielding films (OD is 2.8 or more) each having a laminated structure of a lower layer (light-shielding layer) and an upper layer (front-surface antireflection layer) and adapted to produce various phase differences were manufactured and the line & space patterns were each exposed and transferred to an object (resist film on a semiconductor wafer, or the like). In this simulation, the calculation was carried out by setting the illumination condition of ArF exposure light to annular illumination. In the graph, the pitch on the abscissa axis represents the full pitch of a line & space pattern to be exposed and transferred to the object.

From FIG. 1, it can be first said that, in the case of any light-shielding film adapted to produce any phase difference, the EMF bias increases as the full pitch of the line & space pattern decreases. In particular, the EMF bias rapidly increases between the full pitches of 120 nm and 110 nm. As a consequence, in the case of the light-shielding film whose phase difference exceeds 60 degrees (e.g. is about 74.2 degrees (estimated from FIG. 1), 81 degrees, or 142 degrees), the EMF bias corresponding to the full pitch of 110 nm exceeds 10.0 nm. On the other hand, in the case of the light-shielding film whose phase difference is 60 degrees or less (e.g. is 60 degrees, 46 degrees, or 13 degrees), the EMF bias corresponding to the full pitch of 110 nm to 90 nm can be suppressed to 10.0 nm or less, which is thus very effective.

As the phase difference of the light-shielding film decreases, the EMF bias decreases.

Further, as the pattern pitch width decreases, the reduction degree of the EMF bias increases in the case of the light-shielding film with the smaller phase difference as compared with the case of the light-shielding film with the larger phase difference. In particular, the EMF bias is largely improved between the full pitches of 100 nm and 90 nm in the case of the light-shielding film with the smaller phase difference as compared with the case of the light-shielding film with the larger phase difference. In other words, the differences in EMF bias between the respective light-shielding films with the different phase differences increase between the full pitches of 100 nm and 90 nm. For example, between the full pitches of 100 nm and 90 nm, the difference in EMF bias (maximum value−minimum value) between the light-shielding films with the phase differences of 13 degrees (minimum) and 142 degrees (maximum) increases from about 9.3 nm to about 12.3 nm.

From the results described above, it is clear that the reduction in the phase difference of the light-shielding film largely contributes to the reduction in EMF bias.

In a simplified example, in the case of a line & space pattern with a full pitch of 90 nm, the space width is 45 nm. When an EMF bias is 45 nm, a space portion is lost on an object upon carrying out exposure and transfer, meaning that no pattern is exposed or transferred. Taking into account that the transfer pattern is surely exposed and transferred to the object, the EMF bias is preferably suppressed to about ¼ or less of the space width (about 10 nm or less). In the simulation results, shown in FIG. 1, using the line & space pattern with the full pitch of 90 nm, the EMF bias cannot be suppressed to 10 nm or less unless the phase difference of the light-shielding film is 60 degrees or less.

Figure 2:
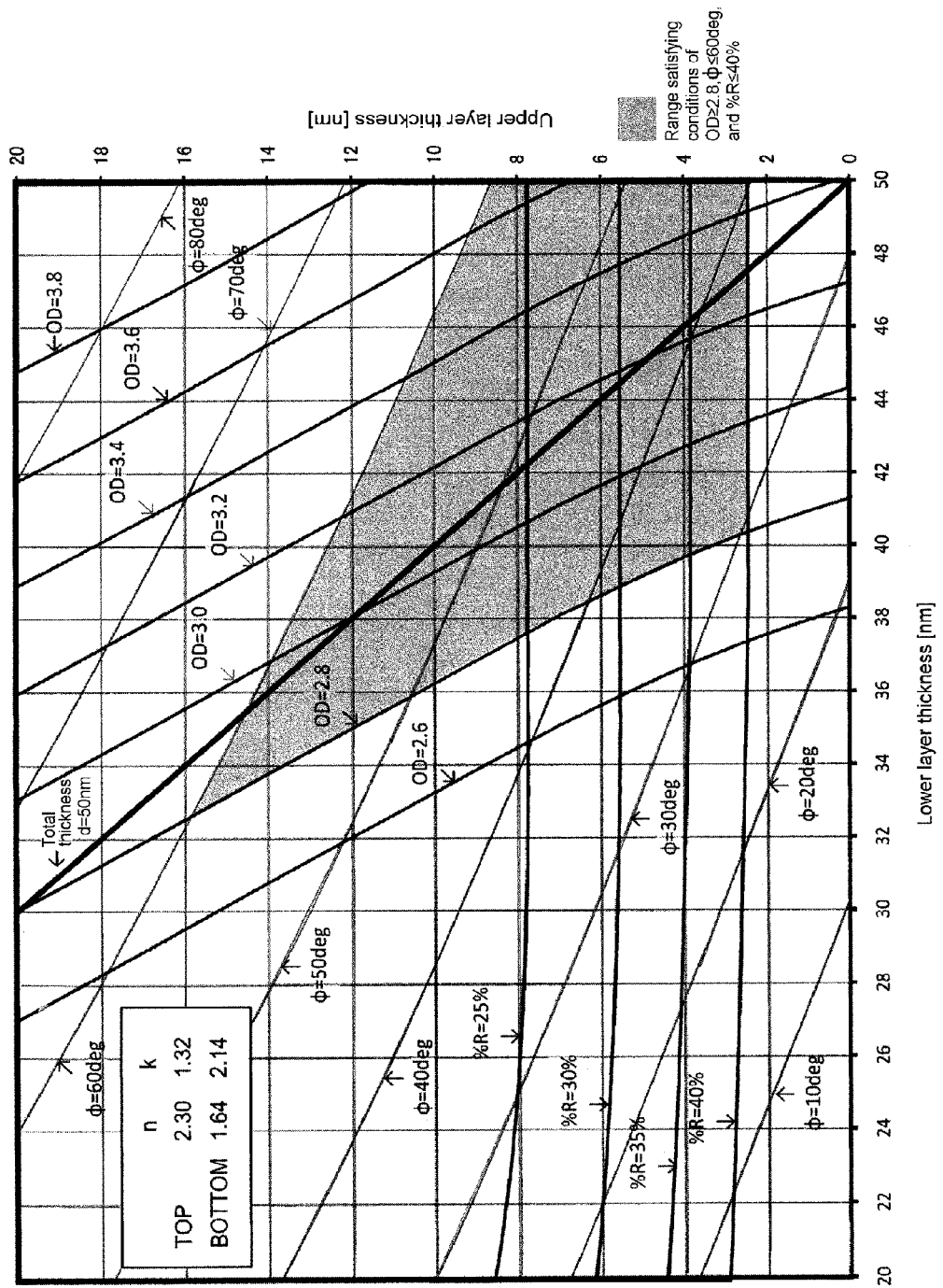
FIG. 2 is a graph showing the results of examining how the total phase shift amount, the total OD, and the front-surface reflectance respectively change when the upper layer thickness and the lower layer thickness are respectively changed in Example 1.
Figure 3:
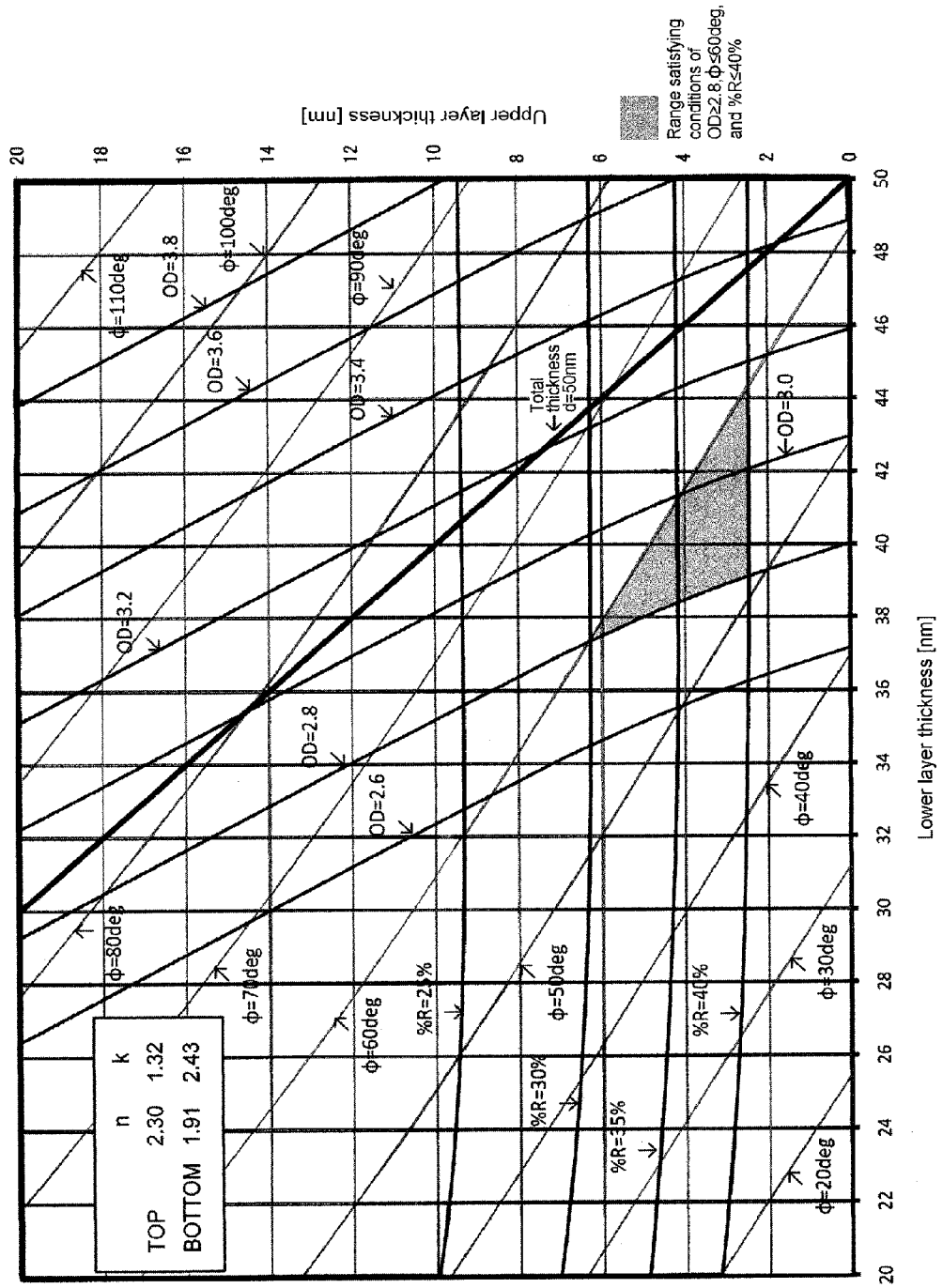
FIG. 3 is a graph showing the results of examining how the total phase shift amount, the total OD, and the front-surface reflectance respectively change when the upper layer thickness and the lower layer thickness are respectively changed in Example 2.

In order to form a light-shielding film adapted to produce a small phase difference, it is necessary to use a material with a small refractive index. However, in general, the light-shielding film is provided with a front-surface antireflection layer for suppressing the front-surface reflection for exposure light. As a material of the front-surface antireflection layer, use is made of a material containing a relatively large amount of oxygen and/or nitrogen and thus having a large refractive index. Therefore, with respect to light-shielding films each having a laminated structure of a lower layer (light-shielding layer) made of a material containing tantalum and nitrogen and an upper layer (front-surface antireflection layer) made of a material containing tantalum and oxygen, simulation was carried out under the following conditions to examine how the total phase shift amount ($\Phi$), the total OD, and the front-surface reflectance respectively change when the upper layer thickness and the lower layer thickness are respectively changed. FIGS. 2 and 3 are graphs showing the results of the simulation.

In the simulation, the properties of the material of the upper (or top) layers were fixed to n=2.30 and k=1.32, while the thicknesses of the upper layers were set to be different from each other in the range of 0 to 20 nm. On the other hand, the properties of the materials of the lower (or bottom) layers were fixed to Condition 1 (n=1.64, k=2.14) and Condition 2 (n=1.91, k=2.43), respectively, while the thicknesses of the lower layers were set to be different from each other in the range of 20 nm to 50 nm.

As described above, if the phase difference of a light-shielding film is 60 degrees or less, even when the full pitch of a transfer pattern (line & space pattern) formed in the light-shielding film is 90 nm on a transfer object (resist film on a semiconductor wafer), the EMF bias can be suppressed to 10 nm or less, which is thus very effective.

From FIGS. 2 and 3 (particularly from FIG. 2), it is seen that the thickness of the lower layer should be set to 33 nm or more in order to achieve the optical density of 2.8 or more and the phase difference of 60 degrees or less.

As described above, owing to the development of exposure apparatuses in recent years, the influence of front-surface reflection from a light-shielding film upon exposure and transfer has been decreasing so that even if the front-surface reflectance is more or less greater than conventional, it tends to be allowed.

When the front-surface reflectance of the light-shielding film is loosely set to 40% or less taking the above into account, it is seen from FIGS. 2 and 3 that if the thickness of the upper layer is 3 nm or more (in the case of the laminated structure with the lower layer containing tantalum and nitrogen), the front-surface reflectance can be suppressed to 40% or less.

In this invention, it is desirable that the lower layer (the light-shielding layer) has a refractive index n of less than 2.0 and an extinction coefficient k of 2.0 or more (structures 2, 6).

In this invention, since the EMF bias can be more reduced as the refractive index n of the lower layer (light-shielding layer) decreases, it is preferably 1.90 or less, more preferably 1.80 or less, and optimally 1.70 or less (see FIGS. 2 and 3).

In this invention, in terms of providing a sufficiently high optical density and in terms of reducing the EMF bias, the extinction coefficient k of the lower layer (light-shielding layer) is preferably 2.0 or more and more preferably 2.1 or more, 2.2 or more, 2.3 or more, or 2.4 or more (see FIGS. 2 and 3).

Figure 4:
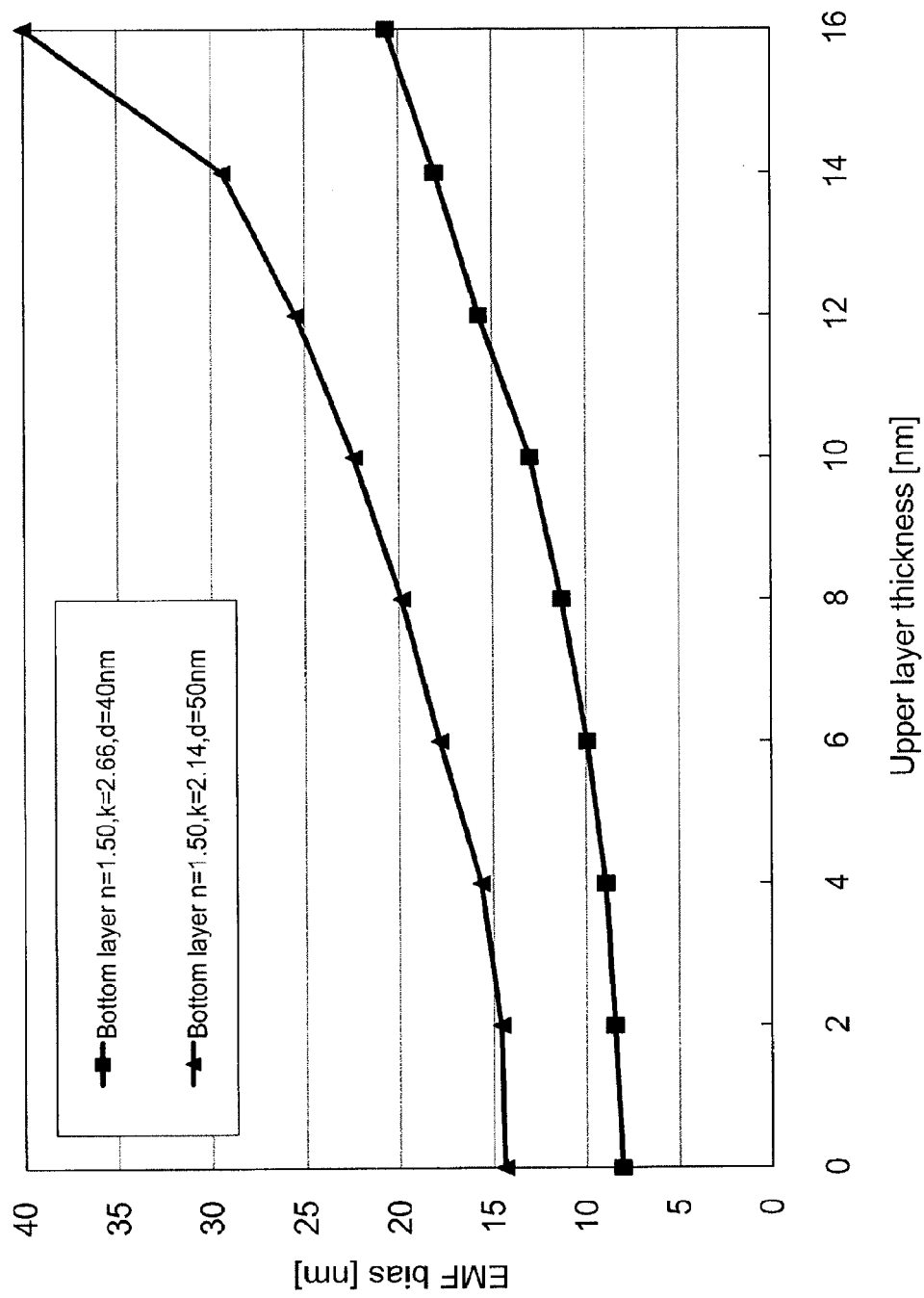
FIG. 4 is a graph showing the relationships between the upper layer thickness and the EMF bias.

FIG. 4 shows the results of simulation of EMF biases with respect to light-shielding films each having a laminated structure of a lower layer and an upper layer, wherein the conditions of the lower layers were fixed, while the thicknesses of the upper layers were set to be different from each other. Specifically, the properties of a material of the upper layers were fixed to n=2.35 and k=0.99, while the thicknesses of the upper layers were set to be different from each other by 2 nm in the range of 0 to 16 nm. On the other hand, the properties of materials of the lower (or bottom) layers were fixed to Condition 1 (n=1.50, k=2.66, thickness d=40 nm) and Condition 2 (n=1.50, k=2.14, thickness d=50 nm), respectively. The material and thickness of the lower layer were selected such that a predetermined optical density (OD: 2.8 or more) could be ensured only by the lower layer. A transfer pattern to be exposed and transferred to an object using a transfer mask was a line & space pattern with a full pitch of 80 nm. The illumination condition of ArF exposure light was set to annular illumination. From the results shown in FIG. 4, it is seen that the EMF bias increases as the thickness of the upper layer increases. It is also seen that the EMF bias decreases as the extinction coefficient k of the lower layer increases (as the thickness of the lower layer decreases).

In this invention, the thickness of the lower layer (light-shielding layer) is, for example, preferably 50 nm or less from FIGS. 2 and 3. In terms of further suppressing the EMF bias, the thickness of the lower layer is more preferably 48 nm or less, 46 nm or less, 44 nm or less, 43 nm or less, 42 nm or less, or 41 nm or less (see FIGS. 2 and 3).

In this invention, it is desirable that the upper layer (front-surface antireflection layer) has an extinction coefficient k of 1.3 or more (structures 3, 7).

This is because if the extinction coefficient k of the upper layer is increased within a range where the antireflection function is excellently implemented, it is possible to further reduce the thickness of the lower layer which is necessary for ensuring a predetermined optical density required for the entire light-shielding film.

In this invention, in terms of providing an excellent antireflection function, the extinction coefficient k of the upper layer (front-surface antireflection layer) is preferably less than 2.0, more preferably 1.7 or less, and further preferably 1.5 or less.

As seen from FIGS. 2, 3, and 4, the phase difference over the entire light-shielding film decreases as the thickness of the upper layer (front-surface antireflection layer) decreases.

In this invention, in terms of providing an excellent antireflection function, the refractive index n of the upper layer (front-surface antireflection layer) is preferably 2.00 or more, more preferably 2.10 or more, and further preferably 2.20 or more. In terms of further suppressing the EMF bias, the refractive index n of the upper layer is preferably 2.50 or less, more preferably 2.40 or less, and further preferably 2.30 or less (see FIGS. 2 and 3).

In this invention, the thickness of the upper layer (front-surface antireflection layer) is, for example, preferably 15 nm or less from FIGS. 2 and 3. In terms of further suppressing the EMF bias, the thickness of the upper layer is more preferably 10 nm or less, 6 nm or less, 5 nm or less, or 4 nm or less.

In this invention, the upper layer (front-surface antireflection layer) is a layer formed by deposition for the purpose of preventing the front-surface reflection. In this invention, the upper layer (front-surface antireflection layer) does not have a structure only with a film formed at a surface of the light-shielding film by surface oxidation, a structure only with a film formed at a surface of the light-shielding film by heating, or the like.

In this invention, also from the results of FIGS. 1, 2, and 3 and so on, the phase difference over the entire light-shielding film is preferably 60 degrees or less and more preferably 50 degrees or less, 40 degrees or less, or 30 degrees or less in terms of suppressing the EMF bias.

In this invention, the front-surface reflectance of the light-shielding film for ArF exposure light is preferably 40% or less, more preferably 35% or less, and further preferably 30% or less.

If the front-surface reflectance of the light-shielding film for ArF exposure light exceeds 40%, it is not preferable because the front-surface reflection from the light-shielding film largely affects exposure and transfer.

As described above, this invention is an invention aimed at suppressing an EMF bias by reducing the phase difference over the entire light-shielding film, as compared with conventional, that has not hitherto been paid attention to or controlled in a binary mask or a binary mask blank.

Further, this invention is an invention aimed at suppressing an EMF bias by designing such that the phase difference produced by an upper layer (front-surface antireflection layer) becomes small.

Further, this invention is an invention aimed at suppressing an EMF bias by largely reducing, as compared with conventional, the phase difference produced by an upper layer (front-surface antireflection layer).

Further, this invention is an invention aimed at suppressing an EMF bias by considerably reducing, as compared with conventional, the thickness of an upper layer (front-surface antireflection layer).

In this invention, the light-shielding film has a laminated structure of a lower layer (light-shielding layer) and an upper layer (front-surface antireflection layer).

Figure 5:
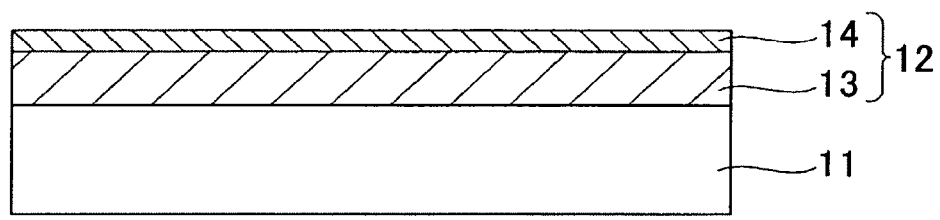
FIG. 5 is an exemplary cross-sectional view showing a mask blank according to an embodiment of this invention.

For example, as shown in FIG. 5, a mask blank of this invention comprises, on a transparent substrate 11, a light-shielding film 12 having a laminated structure of a lower layer (light-shielding layer) 13 and an upper layer (front-surface antireflection layer) 14.

In this invention, in terms of improving the problem of the electromagnetic field (EMF) effect, it is effective to achieve a reduction in thickness by the use of the structure having no back-surface antireflection layer.

In this invention, the light-shielding film comprises at least two layers, i.e. a lower layer (light-shielding layer) made of a material containing tantalum and nitrogen and an upper layer (front-surface antireflection layer) formed in contact with and above the lower layer and made of a material containing tantalum and oxygen.

As the material containing tantalum and nitrogen, use can be made of, for example, TaN, TaON, TaCN, TaBON, TaBN, TaBCN, or the like.

It is preferable to reduce as much as possible an element (particularly, oxygen, nitrogen, carbon, hydrogen, or inert gas (helium, argon, xenon)) that is adapted to increase the refractive index n of the lower layer or to reduce the extinction coefficient k of the lower layer. A metal such as zirconium, hafnium, or niobium may be added to the material containing tantalum and nitrogen within a range that does not much change the properties of the material.

By nitriding tantalum in the lower layer, it is possible to prevent oxidation of side walls of a transfer pattern of the light-shielding film after the manufacture of a transfer mask. Further, it is possible to reduce the back-surface reflectance (reflectance at the interface between the transparent substrate and the lower layer) for ArF exposure light. On the other hand, in order to ensure high light-shielding performance, it is preferable to reduce the content of nitrogen as much as possible. Taking these into account, the nitrogen content in the lower layer is preferably 1 at % or more and 20 at % or less and more preferably 5 at % or more and 15 at % or less.

As the material containing tantalum and oxygen, use can be made of, for example, TaO, TaON, TaBO, TaBON, or the like. A metal such as zirconium, hafnium, or niobium may be added to the material containing tantalum and oxygen within a range that does not much change the properties of the material.

The front-surface antireflection layer (upper layer) made of tantalum oxide containing 50 at % or more oxygen is preferable because it is excellent in antireflection effect. The oxygen content in the material forming the upper layer is more preferably 55 at % or more and further preferably 60 at % or more.

In this invention, the upper layer and the lower layer are preferably formed by sputtering. For achieving a desired refractive index n and extinction coefficient k of a thin film such as the upper or lower layer, it is first necessary to adjust the composition of a material that forms the thin film. For example, as the oxygen content in the material increases, the extinction coefficient k tends to decrease, while, as the nitrogen content in the material increases, the refractive index n tends to increase and the extinction coefficient k tends to decrease. However, the refractive index n and the extinction coefficient k are not determined only by the composition of the material that forms the thin film. This is because the refractive index n and the extinction coefficient k can also be adjusted by adjusting the power applied to a sputtering target, adjusting the gas pressure in a sputtering chamber during sputtering, or the like. The upper and lower layers of this invention are each adjusted to have the desired refractive index n and extinction coefficient k by synthetically using these techniques.

In this invention, the mask blank may be a binary mask blank or a resist-coated mask blank.

In this invention, the transfer mask may be a binary mask which does not use the phase shift effect, may be a reticle, or may be a dug-down Levenson-type phase shift mask that produces the phase shift effect by forming dug-down portions on a substrate. In this invention, an enhancer mask and a phase shift mask are not included.

The mask blank of this invention is applicable to a binary mask blank for use in single exposure, double patterning, or double exposure.

The double patterning is a technique that carries out twice a series of processes of resist coating, exposure, development, and resist stripping with respect to a semiconductor wafer, thereby carrying out patterning. That is, exposure of a transfer pattern is carried out once with respect to a resist film on the wafer in the same manner as conventional single exposure, wherein overlapping exposure portions are subjected to exposure of four times at maximum due to leakage light.

The double exposure is a technique that carries out exposure of a transfer pattern onto a resist film on a semiconductor wafer using a first transfer mask and then carries out exposure of a transfer pattern onto the same resist film using a second transfer mask.

In this invention, the resist is preferably a chemically amplified resist. This is because it is suitable for high-accuracy processing.

This invention is applicable to mask blanks of the generations aimed at a resist film thickness of 100 nm or less, a resist film thickness of 75 nm or less, and further a resist film thickness of 50 nm.

In this invention, the resist is preferably a resist for electron beam writing. This is because it is suitable for high-accuracy processing.

This invention is applicable to an electron beam writing mask blank adapted to be formed with a resist pattern by electron beam writing.

In this invention, as the transparent substrate, use can be made of a synthetic quartz substrate, a $CaF_2$ substrate, a soda-lime glass substrate, an alkali-free glass substrate, a low thermal expansion glass substrate, an aluminosilicate glass substrate, or the like.

A method of manufacturing a transfer mask according to this invention includes an etching step of patterning, by etching, the light-shielding film in the mask blank according to anyone of the aforementioned structures (structure 4).

Further, in the binary transfer mask according to this invention, the transfer pattern of the light-shielding film includes a line & space pattern of half-pitch 45 nm or less (structure 8).

According to the above-mentioned transfer mask of this invention, using the mask blank having the light-shielding film with the reduced EMF bias, various loads applied to the manufacture of the transfer mask are largely reduced. Further, the transfer mask of this invention can simultaneously satisfy a condition that the light-shielding film ensures an optical density that can prevent sensitization of a resist film on a semiconductor wafer due to leakage light caused by overlapping exposure.

The transfer mask of this invention is applicable to a transfer mask for use in single exposure, double patterning, or double exposure.

A method of manufacturing a semiconductor device according to this invention includes exposing and transferring the transfer pattern to a resist film on a semiconductor substrate using the binary transfer mask according to anyone of the aforementioned structures (structure 9).

Further, in a method of manufacturing a semiconductor device according to this invention, a circuit pattern formed on a semiconductor wafer includes a line & space pattern of half-pitch 45 nm or less (structure 10).

The transfer mask of this invention is excellent in transfer accuracy of a line & space pattern of half-pitch 45 nm or less and is most suitable for forming on a semiconductor wafer a circuit pattern having a line & space pattern of half-pitch 45 nm or less.

EXAMPLES

Hereinbelow, this invention will be described in more detail with reference to Examples.

Example 1

Manufacture of Mask Blank

As shown in FIG. 5, using a synthetic quartz glass substrate having a 6-inch square size with a thickness of 0.25 inches as a transparent substrate 11, a TaN film (lower layer: light-shielding layer 13) and a TaO film (upper layer: front-surface antireflection layer 14) were formed in this order as a light-shielding film 12 on the transparent substrate 11.

Specifically, using a Ta target, reactive sputtering (DC sputtering) was carried out in a mixed gas atmosphere of xenon (Xe) and nitrogen ($N_2$), thereby forming the lower layer (TaN film) 13 to a thickness of 42.5 nm on the transparent substrate 11.

Then, using a Ta target, reactive sputtering (DC sputtering) was carried out in a mixed gas atmosphere of argon (Ar) and oxygen ($O_2$), thereby forming the upper layer (TaO film) 14 to a thickness of 5.5 nm on the lower layer 13.

(Evaluation)

The total thickness of the light-shielding film 12 was set to 48 nm. The optical density (OD) of the light-shielding film 12 was 3.02 at the wavelength 193 nm of ArF excimer laser exposure light.

The front-surface reflectance and the back-surface reflectance of the light-shielding film 12 were respectively 30.5% and 38.8% at the wavelength of 193 nm. The optical density (transmittance) and the reflectance were measured using a spectrophotometer.

The TaN film (lower layer 13) had a refractive index n of 1.64 and an extinction coefficient k of 2.14.

The TaO film (upper layer 14) had a refractive index n of 2.30 and an extinction coefficient k of 1.32.

The phase difference (phase shift angle) between exposure light transmitted through the light-shielding film 12 and exposure light transmitted in air for a distance equal to the thickness of the light-shielding film 12 was examined and, as a result, it was 49 degrees.

Before manufacturing a binary transfer mask adapted to be applied with ArF exposure light and having a transfer pattern including a line & space pattern (L&S) of DRAM half-pitch (hp) 45 nm according to the semiconductor device design rule, simulation for examining an EMF bias was carried out using a mask blank of Example 1. As a result, the EMF bias was 7.85 nm in the case of annular illumination.

FIG. 2 is a graph showing the results of examining how the total phase shift amount ($\Phi$), the total OD, and the front-surface reflectance of the entire light-shielding film 12 respectively change when the thickness of the upper layer 14 and the thickness of the lower layer 13 are respectively changed in Example 1.

From FIG. 2, it is seen that it is necessary to synthetically study and consider the upper layer thickness, the lower layer thickness, the total thickness, the total phase shift amount, the total OD, and the front-surface reflectance.

From FIG. 2, for example, it is possible to easily derive the upper layer thickness and the lower layer thickness (total thickness can be calculated as the sum of them) that can make the phase difference of the light-shielding film relatively small while satisfying the conditions that the optical density of the light-shielding film is 2.8 or more, that the phase difference of the light-shielding film is 60 degrees or less, and that the front-surface reflectance of the light-shielding film is 40% or less. This is very useful.

From FIG. 2, for example, it is possible to easily derive the upper layer thickness, the lower layer thickness, the total thickness, the total phase shift amount, the total OD, and the front-surface reflectance when the phase difference of the light-shielding film becomes minimum (e.g. about 30 degrees) and thus the EMF bias becomes minimum. This is very useful.

Comparative Example 1

Manufacture of Mask Blank

As shown in FIG. 5, using a synthetic quartz glass substrate having a 6-inch square size with a thickness of 0.25 inches as a transparent substrate 11, a TaN film (lower layer: light-shielding layer 13) and a TaO film (upper layer: front-surface antireflection layer 14) were formed in this order as a light-shielding film 12 on the transparent substrate 11.

Specifically, using a Ta target, reactive sputtering (DC sputtering) was carried out in a mixed gas atmosphere of xenon (Xe) and nitrogen ($N_2$), thereby forming the lower layer (TaN film) 13 to a thickness of 44 nm on the transparent substrate 11.

Then, using a Ta target, reactive sputtering (DC sputtering) was carried out in a mixed gas atmosphere of argon (Ar) and oxygen ($O_2$), thereby forming the upper layer (TaO film) 14 to a thickness of 15 nm on the lower layer 13.

(Evaluation)

The total thickness of the light-shielding film 12 was set to 59 nm. The optical density (OD) of the light-shielding film 12 was 3.54 at the wavelength 193 nm of ArF excimer laser exposure light.

The front-surface reflectance of the light-shielding film 12 was 21.6% at the wavelength of 193 nm. The optical density (transmittance) and the reflectance were measured using a spectrophotometer.

The TaN film (lower layer 13) had a refractive index n of 1.64 and an extinction coefficient k of 2.14.

The TaO film (upper layer 14) had a refractive index n of 2.30 and an extinction coefficient k of 1.32.

The phase difference (phase shift angle) between exposure light transmitted through the light-shielding film 12 and exposure light transmitted in air for a distance equal to the thickness of the light-shielding film 12 was examined and, as a result, it was 71 degrees.

Before manufacturing a binary transfer mask adapted to be applied with ArF exposure light and having a transfer pattern including L&S of DRAM half-pitch (hp) 45 nm according to the semiconductor device design rule, simulation for examining an EMF bias was carried out using a mask blank of Comparative Example 1. As a result, the EMF bias was 15.5 nm in the case of annular illumination. Accordingly, in the case of annular illumination, the EMF bias exceeds 10 nm and thus effective bias correction becomes more complicated. Simulation for bias correction takes time and the shape of a correction pattern to be formed in the light-shielding film 12 becomes more detailed and complicated. That is, with the mask blank of Comparative Example 1, it is difficult to form a transfer pattern including L&S of DRAM half-pitch (hp) 45 nm for a transfer mask which is subjected to annular illumination.

Example 2

Manufacture of Mask Blank

As shown in FIG. 5, using a synthetic quartz glass substrate having a 6-inch square size with a thickness of 0.25 inches as a transparent substrate 11, a TaN film (lower layer: light-shielding layer 13) and a TaO film (upper layer: front-surface antireflection layer 14) were formed in this order as a light-shielding film 12 on the transparent substrate 11.

Specifically, using a Ta target, reactive sputtering (DC sputtering) was carried out in a mixed gas atmosphere of xenon (Xe) and nitrogen ($N_2$), thereby forming the lower layer (TaN film) 13 to a thickness of 42.0 nm on the transparent substrate 11.

Then, using a Ta target, reactive sputtering (DC sputtering) was carried out in a mixed gas atmosphere of argon (Ar) and oxygen ($O_2$), thereby forming the upper layer (TaO film) 14 to a thickness of 3.0 nm on the lower layer 13.

(Evaluation)

The total thickness of the light-shielding film 12 was set to 45 nm. The optical density (OD) of the light-shielding film 12 was 3.01 at the wavelength 193 nm of ArF excimer laser exposure light.

The front-surface reflectance of the light-shielding film 12 was 38.2% at the wavelength of 193 nm. The optical density (transmittance) and the reflectance were measured using a spectrophotometer.

The TaN film (lower layer 13) had a refractive index n of 1.91 and an extinction coefficient k of 2.43.

The TaO film (upper layer 14) had a refractive index n of 2.30 and an extinction coefficient k of 1.32.

The phase difference (phase shift angle) between exposure light transmitted through the light-shielding film 12 and exposure light transmitted in air for a distance equal to the thickness of the light-shielding film 12 was examined and, as a result, it was 58 degrees.

Before manufacturing a binary transfer mask adapted to be applied with ArF exposure light and having a transfer pattern including a line & space pattern (L&S) of DRAM half-pitch (hp) 45 nm according to the semiconductor device design rule, simulation for examining an EMF bias was carried out using a mask blank of Example 2. As a result, the EMF bias was 7.98 nm in the case of annular illumination.

FIG. 3 is a graph showing the results of examining how the total phase shift amount ($\Phi$), the total OD, and the front-surface reflectance of the entire light-shielding film 12 respectively change when the thickness of the upper layer 14 and the thickness of the lower layer 13 are respectively changed in Example 2.

From FIG. 3, it is seen that it is necessary to synthetically study and consider the upper layer thickness, the lower layer thickness, the total thickness, the total phase shift amount, the total OD, and the front-surface reflectance.

From FIG. 3, for example, it is possible to easily derive the upper layer thickness and the lower layer thickness (total thickness can be calculated as the sum of them) that can make the phase difference of the light-shielding film relatively small while satisfying the conditions that the optical density of the light-shielding film is 2.8 or more, that the phase difference of the light-shielding film is 60 degrees or less, and that the front-surface reflectance of the light-shielding film is 40% or less. This is very useful.

From FIG. 3, for example, it is possible to easily derive the upper layer thickness, the lower layer thickness, the total thickness, the total phase shift amount, the total OD, and the front-surface reflectance when the phase difference of the light-shielding film becomes minimum (e.g. about 52 degrees) and thus the EMF bias becomes minimum. This is very useful.

From a comparison between FIGS. 2 and 3, in FIG. 2, the range of the upper layer thickness and the lower layer thickness satisfying the conditions that the optical density of the light-shielding film is 2.8 or more, that the phase difference of the light-shielding film is 60 degrees or less, and that the front-surface reflectance of the light-shielding film is 40% or less is greater than that in FIG. 3 and, therefore, the total phase shift amount, the total OD, and the front-surface reflectance can be synthetically adjusted by changing the upper layer thickness and the lower layer thickness. This is very useful.

Comparative Example 2

Manufacture of Mask Blank

As shown in FIG. 5, using a synthetic quartz glass substrate having a 6-inch square size with a thickness of 0.25 inches as a transparent substrate 11, a TaN film (lower layer: light-shielding layer 13) and a TaO film (upper layer: front-surface antireflection layer 14) were formed in this order as a light-shielding film 12 on the transparent substrate 11.

Specifically, using a Ta target, reactive sputtering (DC sputtering) was carried out in a mixed gas atmosphere of xenon (Xe) and nitrogen ($N_2$), thereby forming the lower layer (TaN film) 13 to a thickness of 44 nm on the transparent substrate 11.

Then, using a Ta target, reactive sputtering (DC sputtering) was carried out in a mixed gas atmosphere of argon (Ar) and oxygen ($O_2$), thereby forming the upper layer (TaO film) 14 to a thickness of 9 nm on the lower layer 13.

(Evaluation)

The total thickness of the light-shielding film 12 was set to 53 nm. The optical density (OD) of the light-shielding film 12 was 3.36 at the wavelength 193 nm of ArF excimer laser exposure light.

The front-surface reflectance of the light-shielding film 12 was 25.4% at the wavelength of 193 nm. The optical density (transmittance) and the reflectance were measured using a spectrophotometer.

The TaN film (lower layer 13) had a refractive index n of 1.91 and an extinction coefficient k of 2.43.

The TaO film (upper layer 14) had a refractive index n of 2.30 and an extinction coefficient k of 1.32.

The phase difference (phase shift angle) between exposure light transmitted through the light-shielding film 12 and exposure light transmitted in air for a distance equal to the thickness of the light-shielding film 12 was examined and, as a result, it was 79 degrees.

Before manufacturing a binary transfer mask adapted to be applied with ArF exposure light and having a transfer pattern including L&S of DRAM half-pitch (hp) 45 nm according to the semiconductor device design rule, simulation for examining an EMF bias was carried out using a mask blank of Comparative Example 2. As a result, the EMF bias was 12.5 nm in the case of annular illumination. Accordingly, in the case of annular illumination, the EMF bias exceeds 10 nm and thus effective bias correction becomes more complicated. Simulation for bias correction takes time and the shape of a correction pattern to be formed in the light-shielding film 12 becomes more detailed and complicated. That is, with the mask blank of Comparative Example 2, it is difficult to form a transfer pattern including L&S of DRAM half-pitch (hp) 45 nm for a transfer mask which is subjected to annular illumination.

(Manufacture of Transfer Mask)

Next, a description will be given of the manufacture of a transfer mask using the above-mentioned Ta-based light-shielding film mask blank.

Figure 6A:
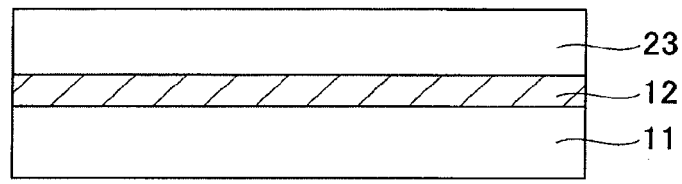
FIG. 6A is an exemplary cross-sectional view for explaining a manufacturing process of a transfer mask according to an Example of this invention.

As shown in FIG. 6A, a resist film (chemically amplified resist for electron beam writing PRL009: manufactured by FUJIFILM Electronic Materials Co., Ltd.) 23 is spin-coated on the light-shielding film 12.

Figure 6B:
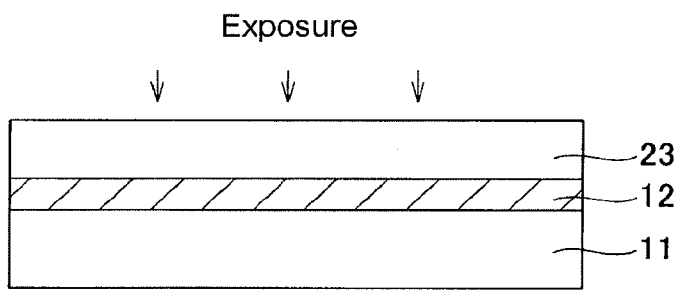
FIG. 6B is an exemplary cross-sectional view for explaining a manufacturing process of the transfer mask according to the Example of this invention.
Figure 6C:
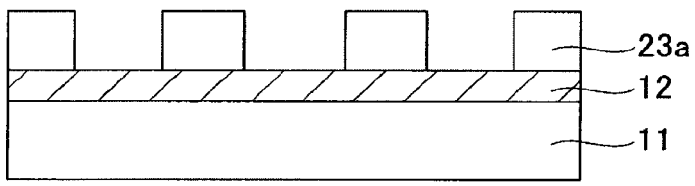
FIG. 6C is an exemplary cross-sectional view for explaining a manufacturing process of the transfer mask according to the Example of this invention.

Then, as shown in FIGS. 6B and 6C, a required pattern is exposed on the resist film 23 and thereafter the resist film 23 is developed with a predetermined developer, thereby forming a resist pattern 23a.

Figure 6D:
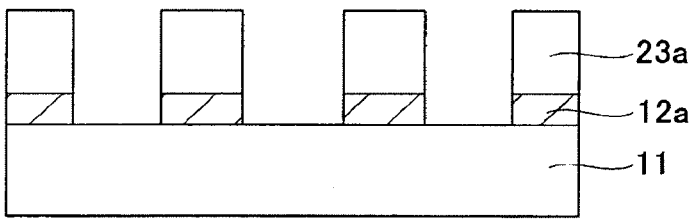
FIG. 6D is an exemplary cross-sectional view for explaining a manufacturing process of the transfer mask according to the Example of this invention.

Then, as shown in FIG. 6D, using the resist pattern 23a as a mask, the light-shielding film 12 is dry-etched such that the upper layer 14 is dry-etched using a fluorine-based gas ($CHF_3$ or the like) (in this event, the surface of the lower layer 13 is also etched to some extent) while the lower layer 13 is dry-etched using a chlorine gas ($Cl_2$ or the like), thereby forming a light-shielding film pattern 12a.

Figure 6E:
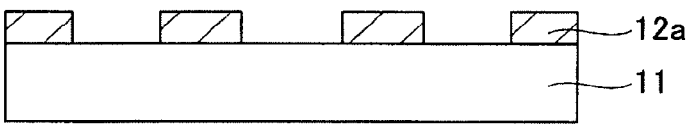
FIG. 6E is an exemplary cross-sectional view for explaining a manufacturing process of the transfer mask according to the Example of this invention.

Finally, as shown in FIG. 6E, the remaining resist pattern is stripped, thereby obtaining a transfer mask 20.

Since the light-shielding film is made of the tantalum-based materials, the transfer mask of this invention has higher durability against ArF excimer laser exposure light as compared with a transfer mask having a light-shielding film made of molybdenum silicide-based materials. As a consequence, the transfer mask of this invention is small in dimensional change and long in lifetime and thus can obtain high reliability.

Then, using each of the binary transfer masks obtained in Examples 1 and 2, a transfer pattern was exposed and transferred to a resist film on a semiconductor wafer as a transfer object. An exposure apparatus was of the immersion type with annular illumination using an ArF excimer laser as a light source. Specifically, by setting the binary transfer mask of Example 1 on a mask stage of the exposure apparatus, a transfer pattern was exposed and transferred to an ArF immersion exposure resist film formed on a semiconductor wafer. Then, the exposed resist film was developed, thereby forming a resist pattern. Then, using the resist pattern as a mask, a circuit pattern including L&S of DRAM half-pitch (hp) 45 nm was formed on the semiconductor wafer. Likewise, with respect to the binary transfer mask of Example 2, exposure, transfer, and other processes were carried out in the same manner for an ArF immersion exposure resist film on another semiconductor wafer, thereby forming a circuit pattern including L&S of DRAM half-pitch (hp) 45 nm on the semiconductor wafer.

The obtained circuit patterns on the semiconductor wafers of Examples 1 and 2 were observed using a transmission electron microscope (TEM). As a result, both circuit patterns fully satisfied the specification of L&S of DRAM half-pitch (hp) 45 nm. That is, it was confirmed that the binary transfer masks of Examples 1 and 2 were fully able to transfer circuit patterns including L&S of DRAM half-pitch (hp) 45 nm onto semiconductor wafers, respectively, even in the case of such an exposure type using annular illumination as a light source.

While this invention has been described with reference to the embodiment and Examples, the technical scope of the invention is not limited to the scope of the description of the above-mentioned embodiment and Examples. It is obvious to those skilled in the art that various changes or improvements can be added to the above-mentioned embodiment and Examples. It is clear from the description of claims that the modes added with such changes or improvements can also be included in the technical scope of this invention.

What is claimed is:

1. A mask blank for manufacturing a binary mask adapted to be applied with ArF excimer laser exposure light, comprising:
    a transparent substrate; and
    a light-shielding film formed on the transparent substrate, the light-shielding film serving to form a transfer pattern;
    wherein the light-shielding film has a laminated structure of a lower layer and an upper layer and has an optical density of 2.8 or more for the exposure light,
    the lower layer has a refractive index n of less than 2.0 and an extinction coefficient k of 2.0 or more and has a thickness of 33 nm or more,
    the upper layer has an extinction coefficient k of 1.3 or more and has a thickness of 3 nm or more, and
    a phase difference between the exposure light transmitted through the light-shielding film and the exposure light transmitted in air for a distance equal to a thickness of the light-shielding film is 60 degrees or less.

2. The mask blank according to claim 1, wherein the upper layer has a refractive index n of 2.5 or less.

3. The mask blank according to claim 1, wherein the upper layer has an extinction coefficient k of less than 2.0.

4. The mask blank according to claim 1, wherein the upper layer has a thickness of 15 nm or less.

5. The mask blank according to claim 1, wherein the light shielding film has a front-surface reflectance of 40% or less for the exposure light.

6. A method of manufacturing a transfer mask, comprising:
    an etching step of patterning, by etching, the light-shielding film in the mask blank according to claim 1.

7. A binary transfer mask adapted to be applied with ArF excimer laser exposure light, comprising:
    a transparent substrate; and
    a light-shielding film formed on the a transparent substrate, the light-shielding film having a transfer pattern;
    wherein the light-shielding film has a laminated structure of a lower layer and an upper layer and has an optical density of 2.8 or more for the exposure light,
    the lower layer has a refractive index n of less than 2.0 and an extinction coefficient k of 2.0 or more and has a thickness of 33 nm or more,
    the upper layer has an extinction coefficient k of 1.3 or more and has a thickness of 3 nm or more, and
    a phase difference between the exposure light transmitted through the light-shielding film and the exposure light transmitted in air for a distance equal to a thickness of the light-shielding film is 60 degrees or less.

8. The binary transfer mask according to claim 7, wherein the upper layer has a refractive index n of 2.5 or less.

9. The binary transfer mask according to claim 7, wherein the upper layer has an extinction coefficient k of less than 2.0.

10. The binary transfer mask according to claim 7, wherein the upper layer has a thickness of 15 nm or less.

11. The binary transfer mask according to claim 7, wherein the light shielding film has a front-surface reflectance of 40% or less for the exposure light.

12. The binary transfer mask according to claim 7, wherein the transfer pattern of the light-shielding film includes a line & space pattern of half-pitch 45 nm or less.

13. A method of manufacturing a semiconductor device, comprising:

exposing and transferring the transfer pattern to a resist film on a semiconductor substrate using the binary transfer mask according to claim 7.

14. The method according to claim 13, wherein the transfer pattern which is transferred to the resist film on the semiconductor substrate includes a line & space pattern of half-pitch 45 nm or less.

* * * * *